US005896875A

United States Patent [19]
Yoneda

[11] Patent Number: 5,896,875
[45] Date of Patent: Apr. 27, 1999

[54] EQUIPMENT FOR CLEANING, ETCHING AND DRYING SEMICONDUCTOR WAFER AND ITS USING METHOD

[75] Inventor: Kenji Yoneda, Kyoto, Japan

[73] Assignee: Matsushita Electronics Corporation, Osaka, Japan

[21] Appl. No.: 08/706,087

[22] Filed: Aug. 30, 1996

[30] Foreign Application Priority Data

Sep. 1, 1995 [JP] Japan ................................ 7-225249

[51] Int. Cl.$^6$ .................... B08B 3/00; B08B 5/00; B08B 7/04
[52] U.S. Cl. .................... 134/102.3; 134/2; 134/3; 134/26; 134/30; 134/31; 134/37; 134/45; 134/100.1; 134/102.1; 134/176; 134/179; 134/902
[58] Field of Search ............................ 134/3, 2, 45, 29, 134/30, 31, 37, 101.1, 102.1, 102.3, 176, 179, 902

[56] References Cited

U.S. PATENT DOCUMENTS

| | | |
|---|---|---|
| 4,982,753 | 1/1991 | Grebinski, Jr. et al. ............. 134/95 |
| 5,186,192 | 2/1993 | Netsu et al. ........................ 134/68 |

OTHER PUBLICATIONS

H. Kawahara, et al., "Removal of Particles on Si Wafers in SC-1 Solution", IEICE Transactions on Elelctronics, vol. E77-C, No. 3, pp. 492–497 (Mar. 1994).

W. Kern, et al., "Cleaning Solutions Based on Hydrogen Peroxide for use in Silicon Semiconductor Technology", RCA Review, pp. 187–206 (Jun. 1970).

W. Kern, "Radiochemical Study of Semiconductor Surface Contamination", RCA Review, pp. 207–233 (Jun. 1970).

*Primary Examiner*—Gary Geist
*Assistant Examiner*—Brian J. Davis
*Attorney, Agent, or Firm*—McDermott, Will & Emery

[57] ABSTRACT

An equipment for cleaning, etching and drying a semiconductor wafer is provided with a process chamber having a closed space of which temperature is capable of being heated and adjusted by a heater; a mesh arranged at the center part in the process chamber and supporting at least one semiconductor wafer to be cleaned; a plurality of spray nozzles arranged in line at the upper part in the process chamber; and a rotary discharge nozzle arranged at the lower part in the process chamber. The spray nozzles spray chemical and ultrapure water with nitrogen gas in mist state, and the rotary discharge nozzle blows out chemical and ultrapure water as jet stream by rotation of a first arm and second arms thereof.

11 Claims, 9 Drawing Sheets

EQUIPMENT FOR CLEANING, ETCHING AND DRYING SEMICONDUCTOR WAFER AND ITS USING METHOD

BACKGROUND OF THE INVENTION

This invention relates to an equipment for cleaning, etching and drying a semiconductor wafer and a method of using it.

In a general process of manufacturing a semiconductor device, particles, heavy metal such as iron, copper, nickel, chromium, light metal such as aluminum, alkali metal such as sodium, potassium, calcium, and various kinds of micro grains result lower production yield, thus they must be reduced. A process of cleaning a semiconductor wafer is the key for reducing the particles. For cleaning the wafer, an equipment for immersing wafer in chemical, namely a dip-type cleaner is mainly used, in which RCA cleaning solutions (mixed solution SC1 of aqueous ammonium, hydrogen peroxide and ultrapure water, mixed solution SC2 of hydrochloric acid, hydrogen peroxide and ultrapure water, and mixed solution of hydrofluoric acid and ultrapure water) which are proposed by W. Kern in RCA Review, vol. 31, page 187, 1970, are widely used as a chemical for cleaning a wafer. Particularly, SC1 is excellent in removing particles and organic contamination, so as to be used in cleaning for removing particles. Also, SC2 is excellent in removing heavy metal and can be used in combination with SC1. For removing organic contamination, mixed solution of sulfuric acid and hydrogen peroxide is used.

Referring to a conventional dip-type cleaner, as shown in FIG. 8, a wafer d to be cleaned which is accommodated in a teflon cassette c is disposed on a mesh b within a bath a which is a container made of quartz or Teflon (PFA or the like) having chemical resistance, then a chemical introducing valve e is opened to introduce and fill a chemical in the bath a through a chemical introducing line f, thereby immersing the wafer d in the chemical in the bath a. In the cleaner, in order to reduce the chemical consumption, a chemical circulation line h is provided for returning the chemical, which is discharged from a drain port provided at the bottom of the bath a, into the bath a again after filtering by a filter g. After treating with the chemical, a ultrapure water introducing valve i is opened to introduce ultrapure water through an ultrapure water introducing line j into the bath a, thereby the chemical is cleaned out from the surface of the wafer d and from the bath a. Wherein, respective references k and l are three-way valves provided in the middle of the chemical circulation line h.

Referring to a series of operation sequence from cleaning to drying of a semiconductor wafer, as shown in FIG. 9, general steps are: cleaning it in the aforementioned dip-type cleaner D1 with the use of a first chemical; cleaning it in another cleaner D2 with the use of a second chemical; cleaning it in a bath E filled with ultrapure water; then drying it by a rotary drying equipment F utilizing centrifugal force or by organic-vapor drying with the use of hot vapor of isopropyl alcohol.

However, the wafer d is immersed in the chemical in the aforementioned dip-type cleaner, which requires large amounts of chemical and ultrapure water, while displaying remarkable power of removing particles and contaminant adhered to the wafer surface. According to plain calculation, chemical of about 65 litters is required for processing 50 wafers d of 200 mm diameter in the Teflon cassette c, and ultrapure water of about 40 litters per minute is required for water rinsing. To save the chemical in even a small amount, the chemical is reused by circulating and filtering it in a set cycle, which contaminates again the wafer surface, because the chemical once contaminated by impurities or by particles eluted thereinto cannot be cleaned even by filtering. Further, it is impossible to reuse circulated and filtered ultrapure water for water rinsing. The conventional operation sequence from cleaning to drying requires transportation of the wafer d among a plurality of baths and equipments D1, D2, E, F, which lowers operation efficiency and causes generation of stain or water marks, water spots due to exposure of the wafer to the air at transportation.

On the other hand, a spray-type cleaner is proposed for reducing used amounts of chemical and ultrapure water, in which the chemical or ultrapure water is sprayed from a spray nozzle to cleaning the wafer in the chamber, while rotating the wafer. The spray-type cleaner has advantages that no re-contamination by the chemical is involved with no circulation of the chemical and that equal or less amount of chemical is used compared with that in the dip-type cleaner employing the circulation and filtering. Moreover, much less amount of ultrapure water is required, compared with that in the dip-type cleaner.

However, the aforementioned spray-type cleaner cleans the wafer insufficiently, compared with the dip-type cleaner. For example, as suggested in the Institute of Electronics, Information and Communication Engineers (IEICE), Transactions On Electronics, vol E77-C, No. 3 (March, 1994), page 492 by Kawahara et al., to remove particles depends on etching amount of the wafer surface by SC1 cleaning solution, so that long time cleaning is required when the temperature of the chemical is low. In general, the temperature of the chemical can be set to 60–80° C. at the highest and treatment time is about 1 or 2 minutes in the spray-type cleaner, which results in that the wafer surface of a silicon substrate can be etched to about 0.5–1 nm. As described above, according to the study by Kawahara et al., the silicon substrate must be etched to 4 nm for sufficient removal efficiency of particles, which is difficult for the spray-type cleaner or which leads to difficulty in attaining a decrease in chemical consumption which is the advantage of the spray-type cleaner. In addition, the spray-type cleaner also involves generation of water marks (stain) due to exposure of wafer to the air.

SUMMARY OF THE INVENTION

The present invention has been made in view to the above problems, and has it object of proposing an equipment for cleaning, etching and drying a semiconductor wafer and a method of using it, which are capable of efficiently cleaning, etching an drying a wafer in one chamber, thereby decreasing used amounts of chemical and ultrapure water and preventing a wafer from re-contamination by chemical and from generation of water marks, while maintaining almost the same cleaning efficiency as in a dip-type cleaner.

An equipment for cleaning, etching and drying a semiconductor wafer according to the present invention comprises: a process chamber having a closed space of which temperature is capable of being heated and adjusted by a heater; a supporting member, provided at the center part in the process chamber, for supporting at least one wafer to be cleaned; a plurality of spray nozzles each provided linearly at the upper part in the process chamber; and a rotary discharge nozzle provided at the lower part of the process chamber.

According to the above equipment for cleaning, etching and drying a semiconductor wafer, the temperature in the process chamber is controlled by the heater, chemical and ultrapure water are sequentially sprayed from the spray nozzle at the upper part in the process chamber and are sequentially blown out as jet stream from the rotary discharge nozzle at the lower part in the process chamber to a wafer to be cleaned which is disposed on the supporting member in the process chamber. Thereby, the chemical and the ultrapure water is saved, while efficiently conducting cleaning or etching. Further, change in fluid (liquids of chemical and ultrapure water and gas such as nitrogen gas) blown out from the spray nozzles and the rotary discharge nozzle enables the equipment to perform a series of operations from cleaning and etching to drying in one process chamber, so that the wafer is not exposed to the air and thereby generating no water marks. This results in attainment of ultraclean surface of the wafer. In addition, the equipment can be reduced in size, while chemical contamination in a clean room is reduced with no diffusion of chemical mist toward outside because of the completely closed state of the equipment. Free combination among cleaning, etching and drying is possible, and almost all processes of cleaning can be performed in the single equipment, which is excellent in practical use.

In the above equipment for cleaning, etching and drying a semiconductor wafer, each of the spray nozzles includes a plurality of spray ports for spraying chemical or ultrapure water, and a nitrogen gas blow-out port for blowing out nitrogen gas for atomization for making the chemical or ultrapure water in mist state. The spray ports of the respective spray nozzles are arranged at almost regular intervals in a direction along which the respective spray nozzles extend. Thereby, the chemical or ultrapure water is sprayed in a mist state with the nitrogen gas for atomization blown from the nitrogen gas blow-out port and spraying the chemical or ultrapure water from the spray ports of the spray nozzles, to thus evenly reach over the front side, side edges and back side of the wafer, which leads to uniform and thorough cleaning or etching of the entire wafer.

In the above equipment for cleaning, etching and drying a semiconductor wafer, the rotary discharge nozzle comprises: a first rotary shaft; a first arm supported at the center part thereof to the upper end of the first rotary shaft and extending in a direction perpendicular to the first rotary shaft; second rotary shafts respectively provided at ends of the first arm; two second arms respectively supported at the center parts thereof to the upper ends of the second rotary shafts and extending in a direction perpendicular to the respective second rotary shafts; and blow-out ports for blowing out chemical or ultrapure water which are respectively provided at both ends of each of the second arms, being upwardly inclined at given angles to the respective second rotary shafts, wherein each of the blow-out ports rotates around the respective second rotary shafts as its axes, while revolving around the first rotary shaft as a center. In so doing, the jet stream of the chemical or ultrapure water blown out from the rotary discharge nozzle uniformly cleans the front side, side edges and back side of the wafer by combination of rotation and revolution of the rotary discharge nozzle, so that all the faces of the wafer are sufficiently contact with the chemical or the like, which leads to the same effects as that obtained by dipping the wafer in the chemical. As a result, cleaning efficiency is enhanced.

The above equipment for cleaning, etching and drying a semiconductor wafer further comprises: a plurality of inline heaters for heating a chemical; a plurality of filters for filtering the chemical to remove foreign matter in the chemical; and a chemical circulation line for selectively forwarding the chemical discharged from a drain port at the lower part of the process chamber to either of the plural inline heaters or the plural filters to blow out again the chemical from the rotary discharge nozzle or the spray nozzles. The provision of the chemical circulation line enables to use again by circulating and filtering the chemical which is once used, thereby remarkably reducing the chemical consumption.

The above equipment for cleaning, etching and drying a semiconductor wafer according further comprises: a plurality of inline heaters for heating chemical; a plurality of filters for filtering, chemical to remove foreign matter from the chemical; and chemical/ultrapure water supply line for selectively forwarding the chemical or ultrapure water to either of the plural inline heaters and the plural filters for heating and filtering the selected one to blow out the heated and filtered one from the rotary discharge nozzle or the spray nozzles. The provision of the supply line enables to supply the new chemical or ultrapure water heated to a set temperature and filtered, with results of enhanced cleaning efficiency and prevention of re-contamination by the chemical.

The equipment for cleaning, etching and drying a semiconductor wafer further comprises: a nitrogen gas supply line for supplying nitrogen gas to the spray ports of the spray nozzles, the nitrogen gas supply line having an inline heater capable of heating the nitrogen gas up to 300° C.; and a nitrogen gas discharge line for discharging nitrogen gas in the process chamber from a discharge port at the upper part of the process chamber. In so doing, the nitrogen gas is heated by the inline heater to a temperature 10° C. higher than that of the chemical to blow out the nitrogen gas from the spray nozzles throughout the supply line for nitrogen substitution in the process chamber, prior to the blow out of the chemical as a cleaning solution from the rotary discharge nozzle and the spray nozzles. As a result, the cleaning power is enhanced and the wafer is prevented from being exposed to the air, thereby preventing generation of water marks on the surface of the wafer.

The above equipment for cleaning, etching and drying a semiconductor wafer, further comprises a gas line, connected to the nitrogen gas supply line, for forwarding gas such as ozone gas, anhydrous hydrogen fluoride gas, HFAC (1,1,1,5,5,5,-hexafluoro-2,4-pentanedione) gas into the process chamber through the nitrogen gas supply line and the spray nozzles. Accordingly, the gas such as ozone gas, anhydrous hydrogen fluoride gas, HFAC is supplied through the spray nozzles to fill the process chamber, so that heavy metal and native oxide is removed from the cleaned or etched wafer surface to thus obtain a clean wafer surface.

In the above equipment for cleaning, etching and drying a semiconductor wafer, the chemical to be used for the cleaning, etching or drying is specified. In detail, as the chemical of cleaning solution, mixed solution of aqueous ammonium, hydrogen peroxide and ultrapure water, mixed solution of hydrochloric acid, hydrogen peroxide and ultrapure water, mixed solution of sulfuric acid and hydrogen peroxide, mixed solution of hydrofluoric acid and ultrapure water, mixed solution of hydrofluoric acid and ammonium fluoride, or mixed solution of hydrofluoric acid, hydrogen peroxide and ultrapure water is used. As the chemical of etching solution, mixed solution of hydrochloric acid and nitric acid, hydrochloric acid or nitric acid is used. An organic solvent such as isopropyl alcohol is used as a drying solution, and ozonized ultrapure water containing ozone of several PPM to 10-odd PPM is used for decreasing roughness of the wafer surface. By such chemicals, the cleaning, etching and drying of the semiconductor wafer is appropriately, thoroughly performed.

A method of using the above equipment for cleaning, etching and drying a semiconductor wafer in the present invention comprises the steps of: sufficiently substituting nitrogen in the process chamber by blowing out from the spray nozzles nitrogen gas which is about 10° C. higher than a set temperature of a cleaning solution after disposing a wafer to be cleaned on the supporting member in the process chamber; forwarding the cleaning solution at the set temperature to the rotary discharge nozzle and cleaning the wafer by blowing out jet stream of the cleaning solution for a set period of time; conducting a final cleaning to the surface of the wafer by spraying new cleaning solution at the set temperature from the spray nozzles for a set period of time; conducting water rinsing to the wafer by blowing out ultrapure water from the rotary discharge nozzle for a set period of time, setting the temperature of the nitrogen gas to be blown out from the spray nozzles to the same temperature as that of the ultrapure water; conducting water rinsing to the wafer by spraying ultrapure water in mist state from the spray nozzles for a set period of time; supplying an organic solvent such as isopropyl alcohol to the spray nozzles to spray from the spray nozzles the organic solvent in hot mist state with hot nitrogen gas of which temperature is set to near the boiling point of the organic solvent; and drying the wafer by blowing out hot nitrogen gas from the spray nozzles, while maintaining the process chamber at hot temperature by the heater of the process chamber.

According to the above method, the wafer is not exposed to the air, and the used amounts of the cleaning solution and ultrapure water are reduced, while attaining efficient performance from cleaning or etching to drying of the wafer.

In the above method of using the equipment for cleaning, etching and drying a semiconductor wafer, etching or polymer removal is conducted by using an etching solution, instead of the cleaning solution. Accordingly, the wafer is not exposed to the air and the used amounts of the cleaning solution and ultrapure water are reduced, while attaining efficient performance of etching and drying of the wafer.

In the above method of using the equipment for cleaning, etching and drying a semiconductor wafer, the step of cleaning or etching the wafer by blowing out the chemical of cleaning solution or etching solution from the rotary discharge nozzle for a set period of time comprises the steps of: collecting the chemical discharged from the rotary discharge nozzle from the drain port at the lower part of the process chamber; heating the thus collected chemical to a set temperature and filtering particles from the chemical; then blowing out the chemical again from the rotary discharge nozzle. Accordingly, the chemical consumption is remarkably reduced by the circulation and reuse thereof.

Another method of using the equipment for cleaning, etching and drying a semiconductor wafer comprises the steps of: sufficiently substituting nitrogen in the process chamber by blowing out from the spray nozzles nitrogen gas which is about 10° C. higher than a set temperature of a first cleaning solution after disposing a wafer to be cleaned on the supporting member in the process chamber; forwarding the first cleaning solution at the set temperature to the rotary discharge nozzle and cleaning the wafer by blowing out jet stream of the first cleaning solution for a set period of time; conducting a final cleaning to the surface of the wafer by spraying new first cleaning solution at the set temperature from the spray nozzles for a set period of time; conducting water rinsing to the wafer by blowing out ultrapure water from the rotary discharge nozzle for a set period of time, setting the temperature of the nitrogen gas to be blown out from the spray nozzles to the same temperature as that of the ultrapure water; conducting water rinsing to the wafer by spraying ultrapure water in mist state from the spray nozzles for a set period of time; repeating the steps of nitrogen substitution, cleanings and the water rinsings, using a second cleaning solution or a third cleaning solution which are different from the first cleaning solution in accordance with a kind of cleaning; supplying an organic solvent such as isopropyl alcohol to the spray nozzles to spray from the spray nozzles the organic solvent in hot mist state with hot nitrogen gas of which temperature is set to near the boiling point of the organic solvent; and drying the wafer by blowing out the hot nitrogen from the spray nozzles, while maintaining the process chamber at hot temperature by the heater of the process chamber.

According to the above method, the wafer is not exposed to the air and the used amounts of the cleaning solution and ultrapure water are reduced, while attaining efficient performance of various kinds of cleanings (e.g., cleanings for removing particles, for removing organic contamination and for removing heavy metal) and drying of the wafer.

Another method of using the above equipment for cleaning, etching and drying a semiconductor wafer comprises the steps of: after disposing a wafer to be cleaned on the supporting member in the process chamber, supplying a gaseous mixture of HFAC gas and nitrogen gas heated at 200° C.–250° C. from the spray nozzles into the process chamber to remove heavy metal on the surface of the wafer; supplying anhydrous hydrogen fluoride gas at room temperature or at a set temperature from the spray nozzles into the process chamber to remove native oxide on the surface of the wafer; conducting water rinsing to the wafer by blowing out ultrapure water from the spray nozzles or the rotary discharge nozzle for a set period of time; supplying an organic solvent such as isopropyl alcohol to the spray nozzles to spray the organic solvent in hot mist state from the spray nozzles with hot nitrogen gas at the temperature near the boiling point of the organic solvent; drying the wafer by blowing out hot nitrogen gas from the spray nozzles, while maintaining the process chamber at hot temperature by the heater of the process chamber; and supplying ozone gas from the spray nozzles into the process chamber to form a ultraclean, thin protection oxide film on the surface of the wafer.

According to the above method, heavy metal and native oxide on the wafer surface are removed without exposure thereof to the air, while forming a thin protection oxide film on the wafer surface, to thus obtain ultraclean surface of the wafer.

DETAILED DESCRIPTION OF THE INVENTION

Described here is an embodiment of the present invention, referring to accompanying drawings.

Figure 1:
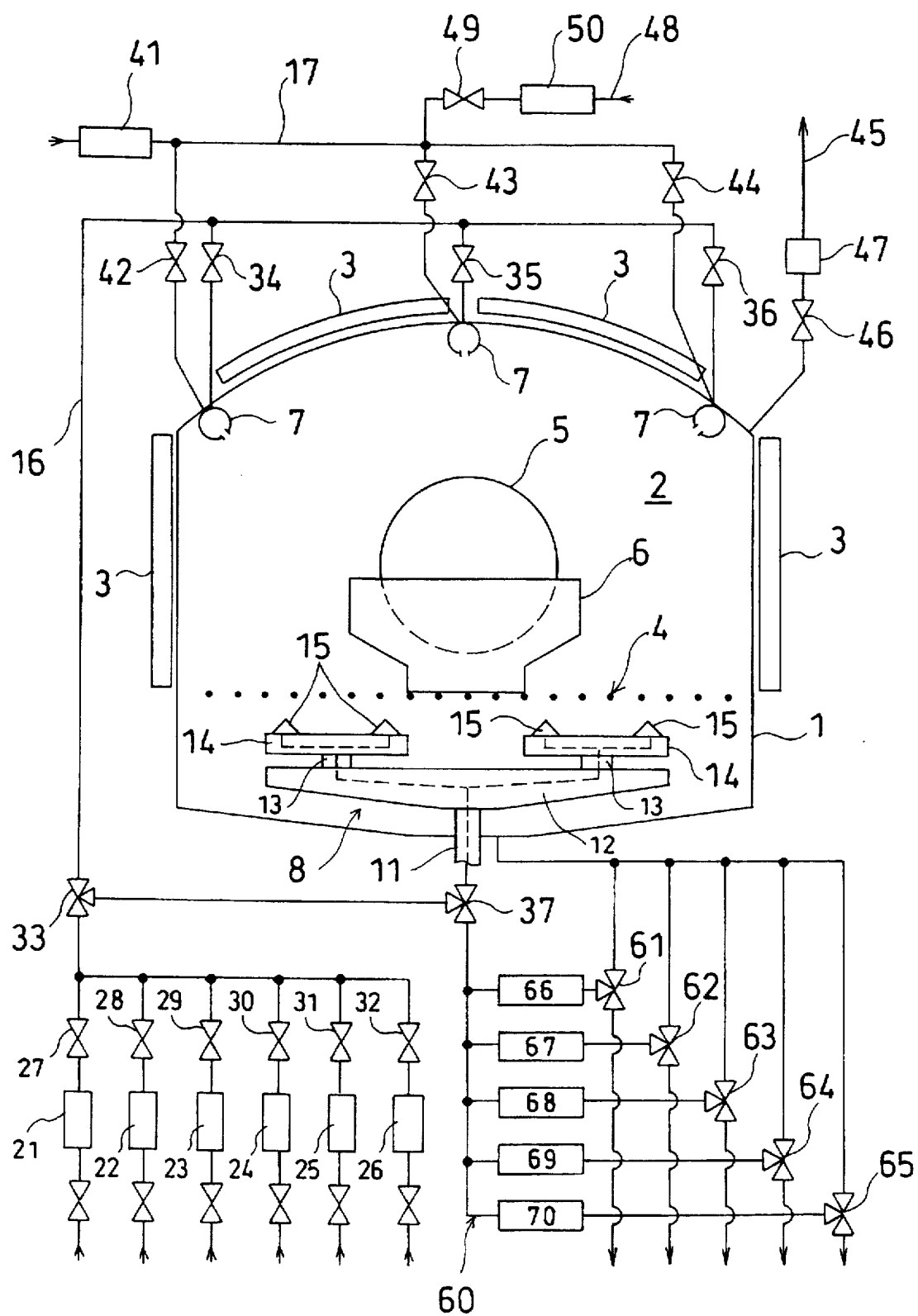
FIG. 1 is a schematic representation showing an equipment for cleaning, etching and drying a semiconductor wafer according to an embodiment of the present invention.

FIG. 1 shows an equipment for cleaning, etching and drying according to the embodiment of the present invention, wherein reference numeral 1 denotes a process chamber having a closed space 2, which is made of quartz coated with Teflon PFA. Chamber heaters 3 are respectively provided on the side surfaces and upper face of the process chamber 1 for controlling temperature in the closed space 2 of the process chamber 1 and for preventing inside of the process chamber 1 from being dried and forming dew.

A grating or mesh 4 is provided as a supporting member at the lower center part in the process chamber 1, and a wafer cassette 6 made of Teflon and accommodating at least one wafer 5 to be cleaned is disposed at a set position on the mesh 4 and is fixed with a holder (not shown). A plurality of spray nozzles 7 (three in FIG. 1) linearly extending parallel to one another are arranged at the upper part in the process chamber 1, and a rotary discharge nozzle 8 is arranged at the lower part in the process chamber 1.

The rotary discharge nozzle 8 comprises a first arm 12 supported at the center part thereof to the upper end of a first rotary shaft 11 of the rotary discharge nozzle 8 and extending in a horizontal direction, two second arms 14 respectively supported at the respective centers thereof to the upper ends of second rotary shafts 13 provided at the respective ends of the first arm 12 and respectively extending in a horizontal direction, and blow-out ports 15 respectively provided at t he ends of the second arms 14 for blowing out chemical and ultrapure water in two upward directions respectively incline d at pre determined angles, e.g. at 45° and 315° inclined in a clockwise direction with respect to a perpendicular line.

The first arm 12 is revolvable around its axis of the first rotary shaft 11 and each of the second arms 14 is rotatable on its axis of the respective second rotary shafts 13, so that chemical and ultrapure water are blown out from the blow-out ports 15 which rotate around the first arm 12 and revolve around the respective second arms 14. The pressures of the chemical and ultrapure water to be blown out are controlled to be within a range between 1 and 5 kg/cm². The first arm 12 in orbital motion and the second arms 14 rotating on their axes are controlled to rotate 10–120 rounds per minute, respectively.

Referring to a driving apparatus (not shown) for rotating the first and second arms 12, 14, either of a driving apparatus comprising individual motors for the respective arms 12, 14 or a driving apparatus comprising a single motor with a planet gear for rotating the arms 12, 14 may be employed.

Each of the spray nozzles 7 is composed of a pipe made of Teflon PFA, and includes, though not shown, a plurality of spray ports for spraying chemical and ultrapure water and a plurality of nitrogen gas blow-out ports for atomizing the chemical and ultrapure water, both of which are provided at almost regular intervals in a direction that the respective spray nozzles 7 extend (direction across at a right angle to paper in the drawing). A chemical/ultrapure water supply line 16 is connected to the spray ports of the chemical and ultrapure water, and a nitrogen gas supply line 17 is connected to the nitrogen gas blow-out ports.

The chemical/ultrapure water supply line 16 includes inline heater filter blocks 21, 22, 23, 24, 25, 26 for heating and filtering each of five kinds of new chemicals and ultrapure water at the upstream side, and switch valves 27, 28, 29, 30, 31, 32 respectively provided to the corresponding inline heater filter blocks 21–26.

The inline heater filter block 21 and the switch valve 27 are provided for supplying a mixed solution SC1 of aqueous ammonium, hydrogen peroxide and ultrapure water (volume ratio=1:1:16) which is heated at 70° C. by the inline heater filter block 21.

The inline heater filter block 22 and the switch valve 28 are provided for supplying a mixed solution SC2 of hydrochloric acid, hydrogen peroxide and ultrapure water (volume ratio=1:1:16) which is heated at 80° C. by the inline heater filter block 22.

The inline heater filter block 23 and the switch valve 29 are provided for supplying a mixed solution of sulfuric acid and hydrogen peroxide (volume ratio=3:1) which is heated at 130° C. by the inline heater filter block 23.

The inline heater filter block 24 and the switch valve 30 are provided for supplying a mixed solution of hydrofluoric acid, hydrogen peroxide and ultrapure water (volume ratio= 1:3:100) which is heated at 30° C. by the inline heater filter block 24.

The inline heater filter block 25 and the switch valve 31 are provided for supplying isopropyl alcohol IPA that is heated at 25° C. or 100° C. by the inline heater filter block 25.

The inline heater filter block 26 and the switch valve 32 is provided for supplying ultrapure water.

Each inline heater filter block 21–26 is capable of heating chemical up to 180° C. or ultrapure water up to 95° C. as a inline heater.

The chemical/ultrapure water supply line 16 communicates with the spray nozzles 7 via a three-way valve 33 and switch valves 34, 35, 36 which are provided at the downstream side of the switch valves 27–32, and communicates with the rotary discharge nozzle 8 via the three-way valve 33 and another three-way valve 37 provided at the downstream side thereof. Accordingly, when one of the switch valves 27–32 is opened, the chemical or ultrapure water heated and filtered by the corresponding inline heater filter blocks 21–26 is selectively blown out from the rotary discharge nozzle 8 or the spray nozzles 7.

The nitrogen gas supply line 17 includes an inline heater filter block 41 for heating and filtering nitrogen gas, and is capable of heating it up to 300° C.

The nitrogen gas supply line 17 communicates with each spray nozzle 7 via gas switch valves 42, 43, 44 provided at the downstream side of the inline heater filter block 41 so that nitrogen gas heated and filtered by the inline heater filter block 41 is blown out from the nitrogen gas blow-out ports for atomization of each spray nozzle 7 into the process chamber 1. The blow-out amount and pressure of nitrogen gas to be blown out are adjusted according to the sprayed amount of the chemical from the spray nozzles 7 to atomize the chemical. It is possible to set the spray nozzles 7 to blow out only the nitrogen gas for purging or drying the inside of the process chamber 1.

The nitrogen gas in the process chamber 1 is discharged from a discharge port provided at the upper part of the process chamber 1 through a nitrogen gas discharge line 45 provided with a discharge valve 46 and a pressure self-adjusting valve 47 for adjusting pressure in the process chamber 1. The nitrogen gas supply line 17 is connected to a gas line 48 for supplying through the spray nozzles 7 to the process chamber 1 each gas other than the nitrogen gas such as ozone gas, anhydrous hydrogen fluoride gas, HFAC (1,1,1,5,5,5,-hexafluoro-2,4-pentanedione) gas. The gas line 48 is provided with a gas switch valve 49 and an inline heater filter block 50 for heating and filtering such gas to be supplied.

Reference numeral 60 denotes a chemical circulation line for selectively forwarding chemical discharged from a drain port at the lower part of the process chamber 1 to inline heater filter blocks 66, 67, 68, 69, 70 via three-way valves 61, 62, 63, 64, 65 to blow out it from the rotary discharge nozzle 8 or the spray nozzles 7. The chemical is supplied from the inline heater filter blocks 66–70 via the three-way valve 37 to the rotary discharge nozzle 8 when the chemical is blown out from the rotary discharge nozzle 8, and is supplied from the inline heater filter blocks 66–70 via the three-way valves 37, 33 and the switch valves 34–36 to the spray nozzles 7 when the chemical is sprayed from the spray nozzles 7.

The inline heater filter block 66 and the three-way valve 61 are provided for circulating and filtering the mixed solution SC1 of aqueous ammonium, hydrogen peroxide and ultrapure water (volume ratio=1:1:16) which is heated at 70° C. by the inline heater filter block 66.

The inline heater filter block 67 and the three-way valve 62 are provided for circulating and filtering the mixed solution SC2 of hydrochloric acid, hydrogen peroxide and ultrapure water (volume ratio=1:1:16) which is heated at 80° C. by the inline heater filter block 67.

The inline heater filter block 68 and the three-way valve 63 are provided for circulating and filtering the mixed solution of sulfuric acid and hydrogen peroxide (volume ratio=3:1) which is heated at 130° C. by the inline heater filter block 68.

The inline heater filter block 69 and the three-way valve 64 are provided for circulating and filtering the mixed solution of hydrofluoric acid, hydrogen peroxide and ultrapure water (volume ratio=1:3:100) which is heated at 30° C. by the inline heater filter block 69.

The inline heater filter block 70 and the three-way valve 65 are provided for circulating and filtering isopropyl alcohol IPA which is heated at 25° C. or 100° C. by the inline heater filter block 70.

Discussed next is a process of cleaning a silicon wafer 5, using the equipment according to the embodiment, with reference to flow charts of FIGS. 2–7.

Figure 2:
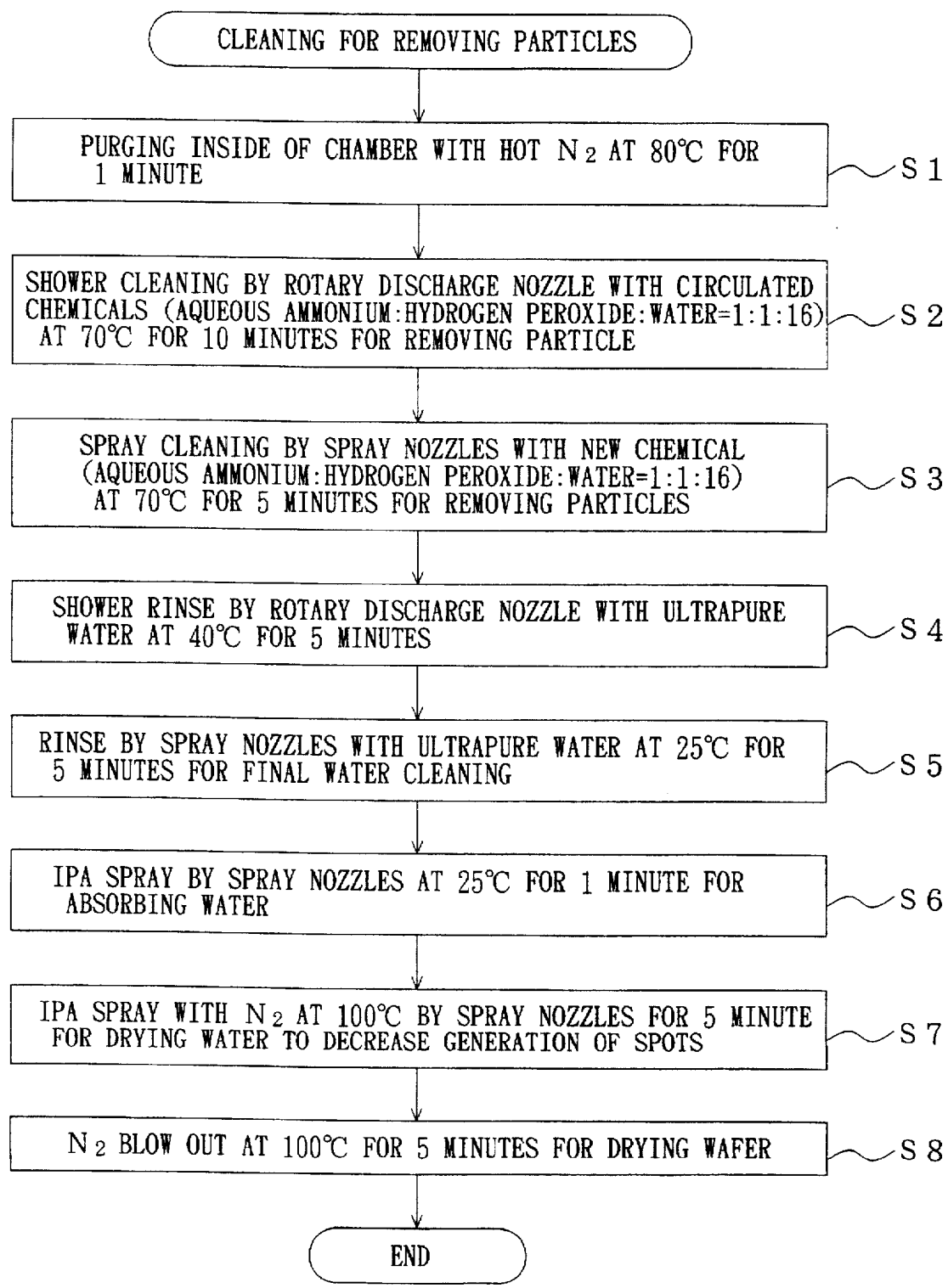
FIG. 2 is a flow chart showing a cleaning process for removing particles according to the embodiment of the present invention.

FIG. 2 is a flow chart showing a cleaning process for removing particles. Initially, after the wafer 5 is set in the wafer cassette 6, the wafer cassette 6 is disposed at a set position on the mesh 4 in the process chamber 1 to start cleaning. At step S1, 60 liters of nitrogen gas are heated at 80° C. by the inline heater filter block 41 is sprayed from the spray nozzles 7 for 1 minute to nitrogen-purge the inside of the process chamber. At this time, the discharge valve 46 is opened and the pressure adjusting valve 47 is adjusted so as to set the pressure in the process chamber 1 to be 1300 hPa. Thereafter, flow amount of the nitrogen gas is set to 20 liters per minute, maintaining the pressure in the process chamber 1. The chamber heater 3 is set at 80° C.

Then, chemical prepared by mixing aqueous ammonium, hydrogen peroxide and ultrapure water with a volume ratio of 1:1:16 is heated at 70° C. by the inline heater filter block 21, and is supplied to the rotary discharge nozzle 8 via the switch valve 27 and the three-way valves 33, 37 (step S2). At this time, the flow amount and supply pressure of the chemical is adjusted so that the discharge pressure thereof is 3 kg/cm$^2$. The jet stream blown out from the blow-out ports 15 of the rotary discharge nozzle 8 efficiently cleans the front side, side edges and back side of the wafer 5 owing to revolution and rotation of the rotary discharge nozzle 8. The period of cleaning by the rotary discharge nozzle 8 is set to 10 minutes. At this time, a region made of silicon and a region made of silicon oxide of the surface of the wafer 5 are etched to about 4.2 nm and 1.8 nm, respectively. This cleaning removes particles or organic contamination on the surface of the silicon wafer 5 effectively.

During the cleaning, the chemical is discharged from a drain port at the lower part of the process chamber 1, is forwarded to the inline heater filter block 66 via the three-way valve 61 of the chemical circulation line 60, is filtered by the inline heater filter block 66, then is forwarded to the rotary discharge nozzle 8 via the three-way valve 37, keeping its temperature at 70° C., to thus be circulated and reused.

After the cleaning, the three-way valve 37 is closed so that the chemical in the process chamber 1 is stored into the inline heater filter block 66 via the three-way valve 61 from the drain port at the lower part of the process chamber 1. Wherein, supply of new chemical is halted by closing the three-way valves 33, 37 to be exchanged to circulation of the used chemical when the chemical is sufficiently stored for circulation.

Next, the chemical (mixed solution SC1 of aqueous ammonium, hydrogen peroxide and ultrapure water) is supplied from the inline heater filter block 21 to the spray nozzles 7 via the switch valve 27, the three-way valve 33 and the switch valves 34, 35, 36. At this time, hot nitrogen gas at 80° C. is already blown out from the spray nozzles 7, therefore the chemical is atomized by the nitrogen gas for atomization so as to spray and clean the wafer 5 (step S3). During this time, though the temperature of the chemical is lowered by about 10° C. by generation of heat of gasification at atomization, the chemical in mist state is kept at 70° C. by the heat of the nitrogen gas for atomization and by the chamber heaters 3. No contamination by the chemical is involved, which is the new chemical. Further, at this final cleaning, metal impurity adhered to the surface of the wafer 5 is removed and discharged chemical is stored into the inline heater filter block 66 via the three-way valve 61. The chemical stored in the inline heater filter block 66 is discharged by an amount equal to that supplied at spray cleaning via the three-way valve 61 at the start of circulation and reuse of the chemical. Since the time period of spray cleaning is set to 5 minutes, new chemical is always supplemented for circulation little by little.

Thereafter, the surface of the wafer 5 is rinsed by ultrapure water. The temperature of nitrogen gas for purging is set at 50° C., and that of the ultrapure water is set at 40° C. by the inline heater filter block 26. The chamber heater 3 is also set at 50° C.

The ultrapure water is forwarded from the inline heater filter block 26 to the rotary discharge nozzle 8 via the switch valve 32 and the three-way valves 33, 37 to perform a cleaning process just the same as the cleaning by the chemical so as to rinse the wafer 5 for 5 minutes by jet stream of ultrapure water blown out from the blow-out ports 15 of the rotary discharge nozzle 8 (step S4). At this time, the used chemical is discharged via the three-way valve 65.

Next, the temperature of the inline heater filter block 26 is changed to 25° C., and the ultrapure water is supplied from the inline heater filter block 26 to the spray nozzles 7 via the switch valve 32, the three-way valve 33 and the switch valves 34, 35, 36. At the same time, the inline heater filter block 41 continuously supplies the nitrogen gas to the spray nozzles 7, setting the temperature thereof to 25° C. The ultrapure water is sprayed in mist state from the spray nozzles 7 to perform final rinse of the wafer 5 (step S5). The time for the spray rinse is set to 5 minutes.

Then, isopropyl alcohol IPA is heated at 25° C. by the inline heater filter block 25, and is supplied to the spray nozzles 7 via the switch valve 31, the three-way valve 33 and the switch valves 34, 35, 36. Since the nitrogen gas at 25° C. is continuously supplied from the spray nozzles 7, the isopropyl alcohol is sprayed in mist state to absorb water of the wafer 5 and the process chamber 1 (step S6).

After 1 minute from the start of the spray of isopropyl alcohol, the temperatures of the inline heater filter blocks 25, 41 are set to 100° C. to continuously perform the spray for 5 minutes (step S7). At this time, the isopropyl alcohol is stored into the inline heater filter block 70 via the three-way valve 65 from the drain port of the process chamber 1. Thereafter, further 5-minute nitrogen gas spray is performed, while keeping the temperature of the inline heater filter block 41 at 100° C. (step S8), to dry the surface of the wafer 5. Since the surface of the wafer 5 is nitrogen-purged from the cleaning by ultrapure water to the spray drying, the wafer 5 is out of contact with the air, with a result of remarkable reduction of generation of water marks or the like.

In order to remove only particles, the wafer 5 is taken out from the equipment at this step to terminate the cleaning process.

Figure 3:
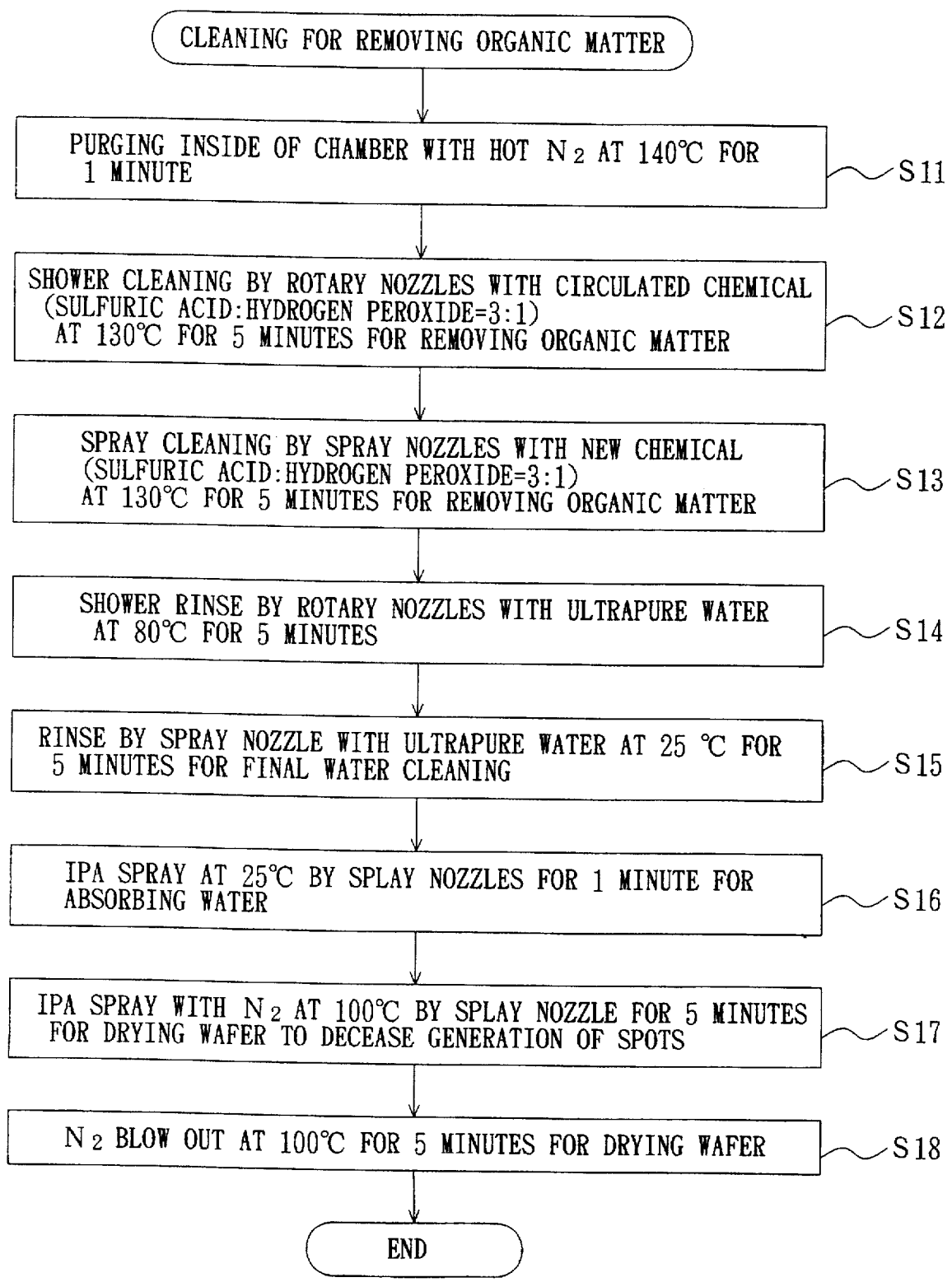
FIG. 3 is a flow chart showing a cleaning process for removing organic contamination according to the embodiment of the present invention.

FIG. 3 is a flow chart showing a cleaning process for removing organic contamination. Various kinds of chemicals are used in the cleaning process of a semiconductor wafer according to purposes, and the temperature of the chemicals are set according to their kinds. For removing organic contamination, mixed solution of sulfuric acid and hydrogen peroxide (volume ratio=3:1) at 130° C. is used as the chemical (steps S12 and S13). The steps of chemical supply, cleaning by ultrapure water and drying are the same as those for removing particles. Wherein, the ultrapure water after the chemical cleaning is heated to 80° C. to perform cleaning by hot ultrapure water (step S14). This is for efficient removal of sulfuric acid which has high viscosity.

Figure 4:
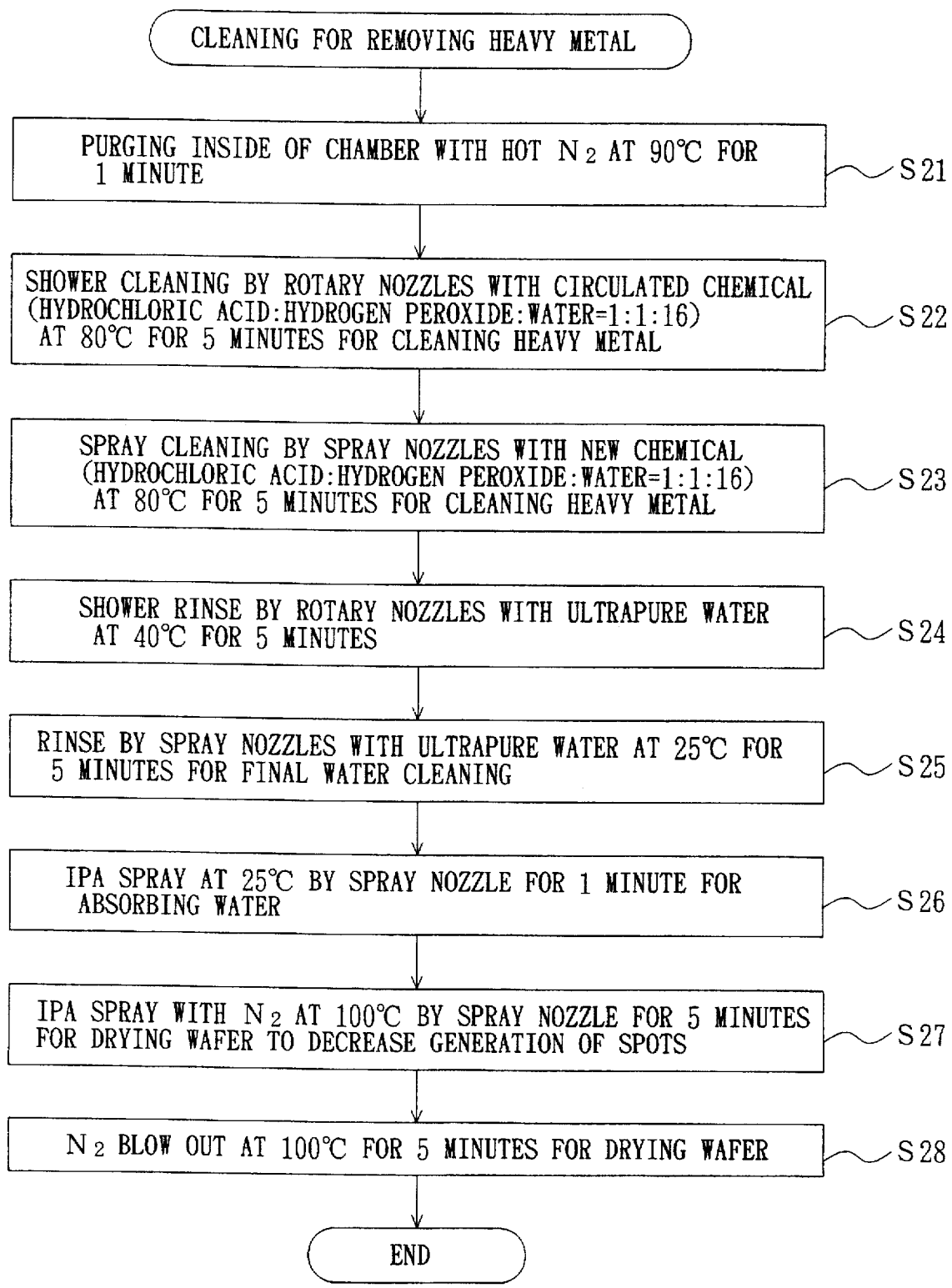
FIG. 4 is a flow chart showing a cleaning process for removing heavy metal according to the embodiment of the present invention.

FIG. 4 is a flow chart showing a cleaning process for removing heavy metal such as ion, copper, nickel, chromium. In this case, the mixed solution SC2 of hydrochloric acid, hydrogen peroxide and ultrapure water (volume ratio= 1:1:16) at 80° C. is used as the chemical (steps S22, S23). The steps of chemical supply, cleaning by ultrapure water and drying are the same as those for removing particles.

In case for removing native oxide, a mixed solution of hydrofluoric acid, hydrogen peroxide and ultrapure water or a mixed solution of hydrofluoric acid and ultrapure water is used as the chemical. In case of composite cleaning of combination of the above cleanings, after the cleaning by ultrapure water subsequent to a first chemical cleaning, a second chemical cleaning is performed without drying step. Then, a third chemical cleaning is performed after the cleaning by ultrapure water. Finally, the drying step is performed after the subsequent cleaning by ultrapure water.

Figure 5:
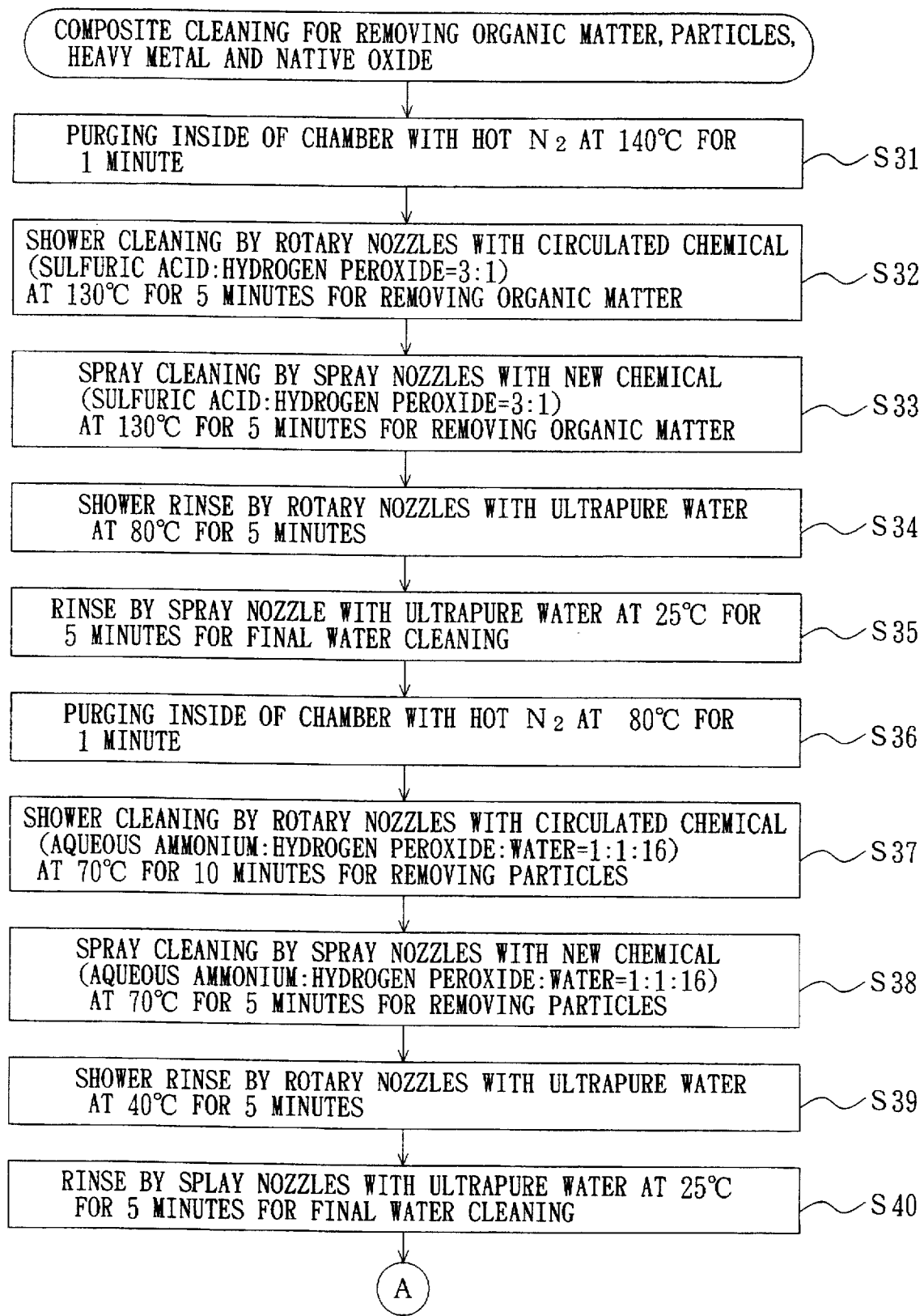
FIG. 5 is a flow chart showing a former half part of a cleaning process exemplifying one composite cleaning according to the embodiment of the present invention.
Figure 6:
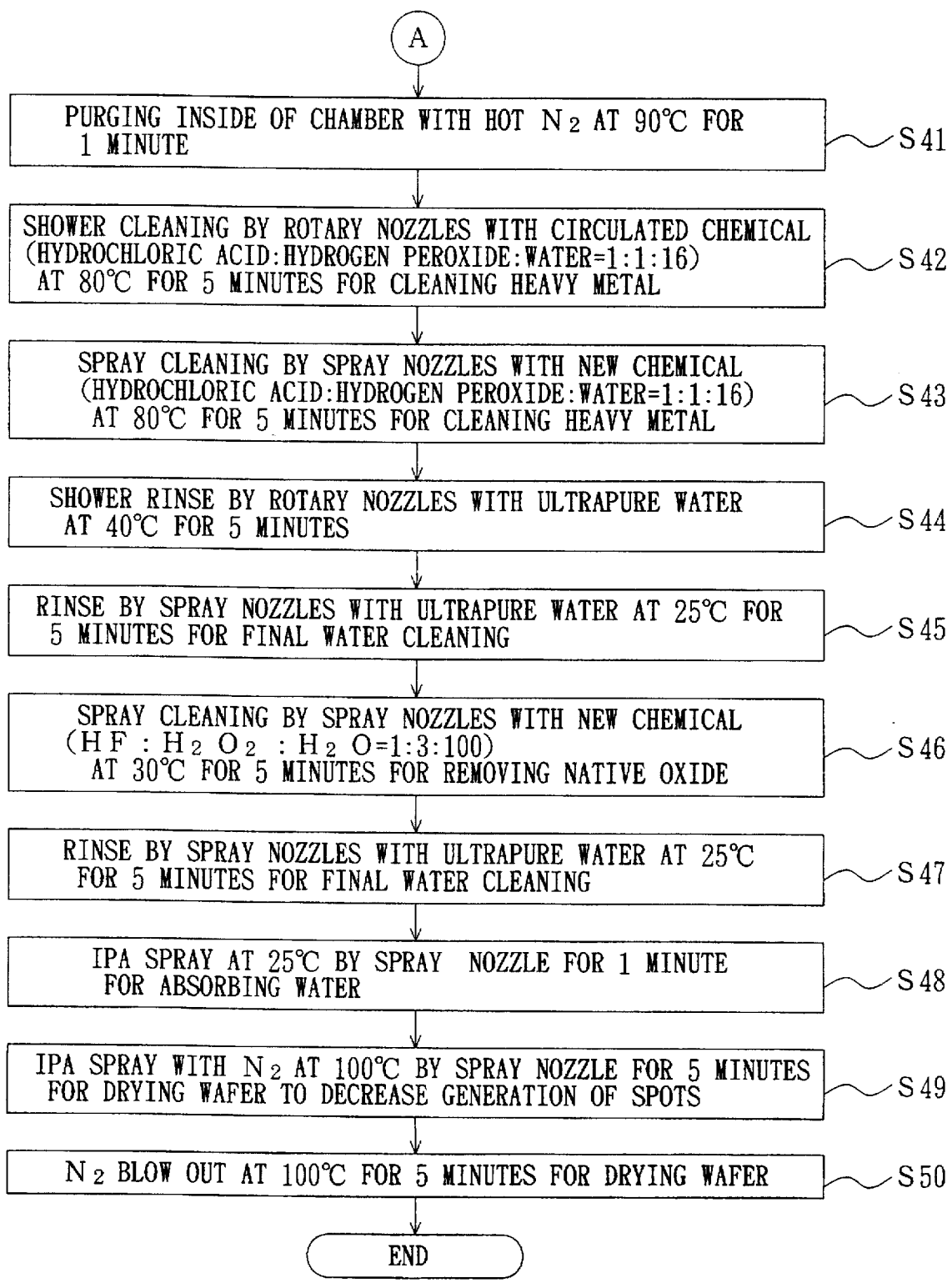
FIG. 6 is a flow chart showing a latter half part of the cleaning process exemplifying the composite cleaning according to the embodiment of the present invention.

FIGS. 5 and 6 are flow charts showing an example of the composite cleaning process.

As shown in FIGS. 5 and 6, hot nitrogen gas at 140° C. which is 10° C. higher than the temperature of a first chemical is blown out for 1 minute from the spray nozzles 7 to fully substitute nitrogen in the process chamber 1 after disposing the wafer 5 to be cleaned on the mesh 4 in the process chamber 1 (step S31). Then, 130° C. mixed solution of sulfuric acid and hydrogen peroxide (volume ratio=3:1) as the first chemical for removing organic contamination is blown out for 5 minutes from the rotary discharge nozzle 8 through circulation and filtering, to thus clean the wafer 5 by jet stream of the mixed solution (step S32).

Next, new mixed solution at 130° C. is sprayed for 5 minutes from the spray nozzles 7 to perform spray cleaning to the surface of the wafer 5 (step S33). Then, the temperature of the nitrogen gas to be blown out from the spray nozzles 7 is changed to 80° C. which is the same as that of the ultrapure water. With this state, 80° C. ultrapure water is blown out from the rotary discharge nozzle 8 to perform water rinsing for 5 minutes (step S34), the ultrapure water is discharged, then 25° C. ultrapure water is sprayed in mist state for 5 minutes from the spray nozzles 7 to perform final cleaning (step S35).

Thereafter, the nitrogen substitution, chemical cleanings and water rinsings (steps S35–S45) are repeated using mixed solution SC1 of aqueous ammonium, hydrogen peroxide and ultrapure water (volume ratio=1:1:16) as the second chemical for removing particles and mixed solution SC2 of hydrochloric acid, hydrogen peroxide and ultrapure water (volume ratio=1:1:16) as the third chemical for removing heavy metal, instead of the first chemical. Wherein, the mixed solution of aqueous ammonium, hydrogen peroxide and ultrapure water is set at 70° C. and that of hydrochloric acid, hydrogen peroxide and ultrapure water is set at 80° C.

Next, 30° C. mixed solution of hydrofluoric acid, hydrogen peroxide and ultrapure water (volume ratio of 1:3:100) as the fourth chemical for removing native oxide is sprayed in mist state for 5 minutes from the spray nozzles 7 (step S46), then performed is final water rinsing of 5-minute spray of 25° C. ultrapure water from the spray nozzles 7 in mist state (step S47). Finally, drying step is performed.

Referring to a detailed drying step, 25° C. isopropyl alcohol IPA is sprayed in mist state from the spray nozzles 7 for 1 minute to absorb water of the wafer 5 and the process chamber 1 (step S48), then the isopropyl alcohol and nitrogen for atomization are heated to 100° C. to perform 5-minute spray (step S49). Next, further 5-minute blow-out of only nitrogen gas is performed, keeping the nitrogen gas at 100° C. (step S50).

In this way, plural combinations of cleaning solutions, rinsing, drying are possible according to purposes of cleanings. Wherein, attention must be paid for cleaning solution which may erode the line pipes and the process chamber of the present equipment.

FIGS. 2–6 are flow charts showing the cleaning processes of a wafer. However, it may be applied to a wafer etching process by using etching solution as the chemical, instead of the cleaning solution. For example, an oxide film is etched by using buffered hydrofluoric acid as the etching solution to be sprayed, and polycrystalline silicon and silicon is etched by using mixed solution of hydrofluoric acid and nitric acid.

Further, the aforementioned solutions such as aqueous ammonium and hydrogen peroxide, sulfuric acid and hydrogen peroxide have a selective etching characteristic to certain kinds of metals such as Ti, and are capable of etching.

When polymer removing solutions of organic amine and of other organic types are used as the etching solution, polymers generated after dry etching can be removed. In case where an organic chemical is used for removing polymers or for etching, rinsing by organic solvent such as IPA may be required prior to rinsing by ultrapure water. Though the cleaning by organic solvent involves problems on health of operators, environment, safety, and the like, the equipment according to the present invention, which is completely closed construction, excludes such the problems.

Figure 7:
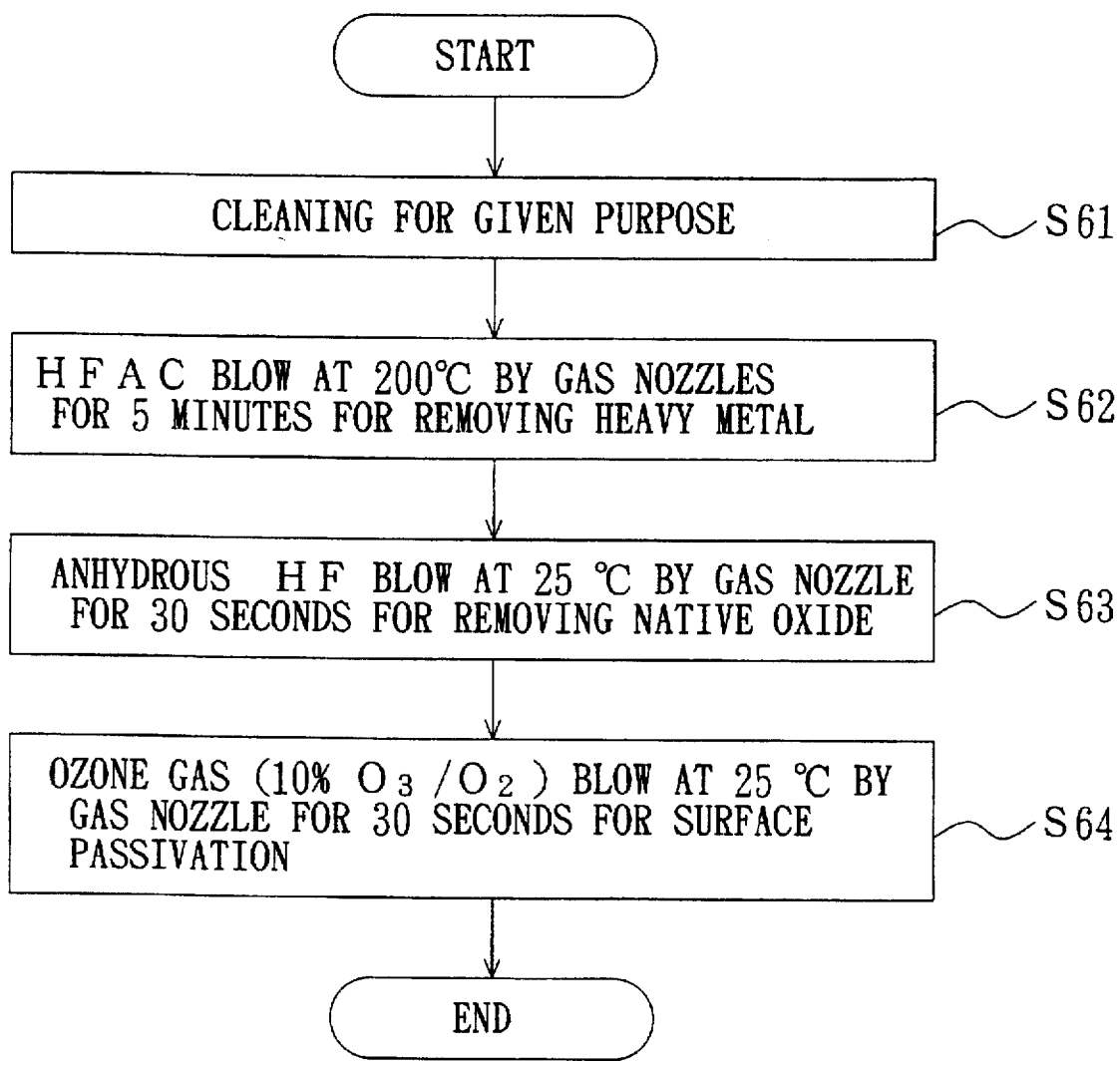
FIG. 7 is a flow chart showing a process of final cleaning by gas according to the embodiment of the present invention.
Figure 8:
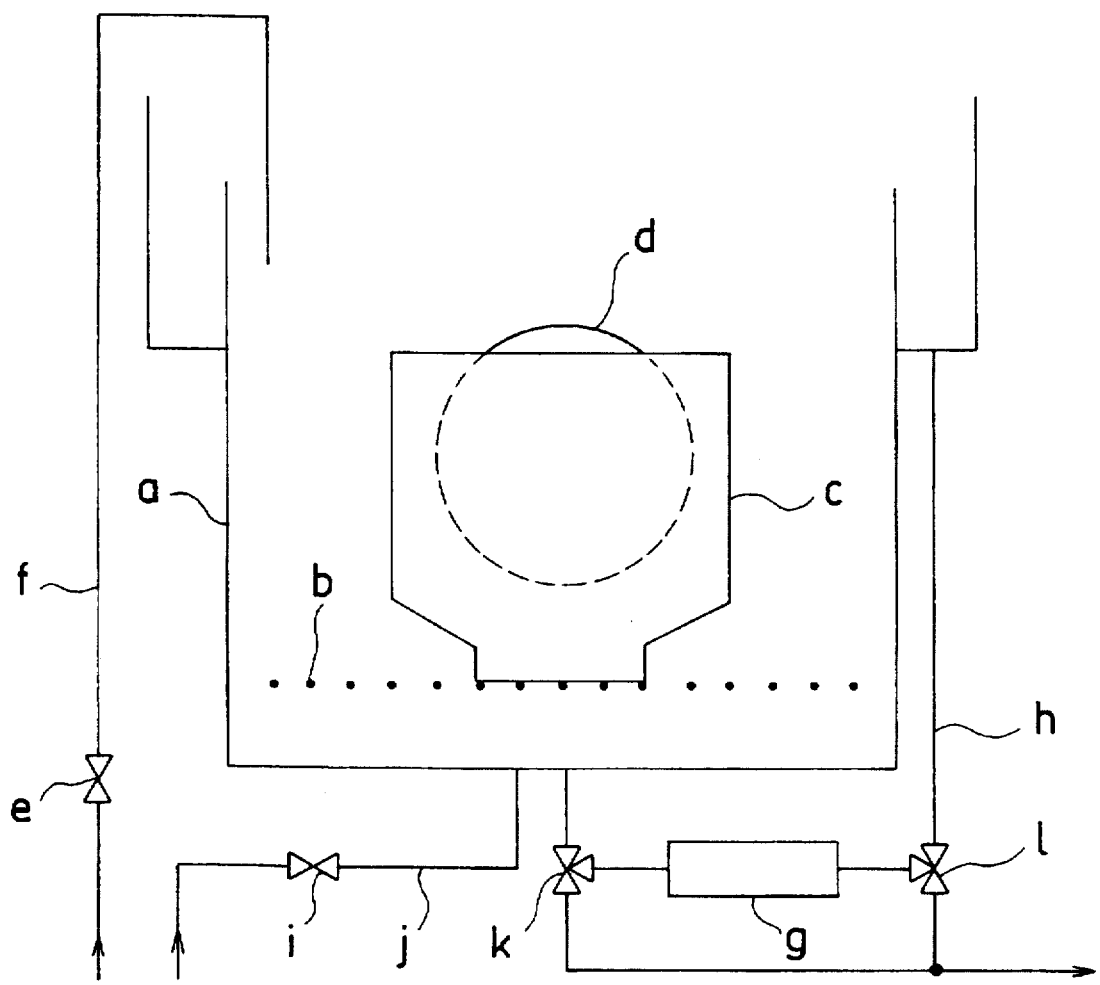
FIG. 8 is a schematic representation showing a conventional dip-type cleaner.
Figure 9:
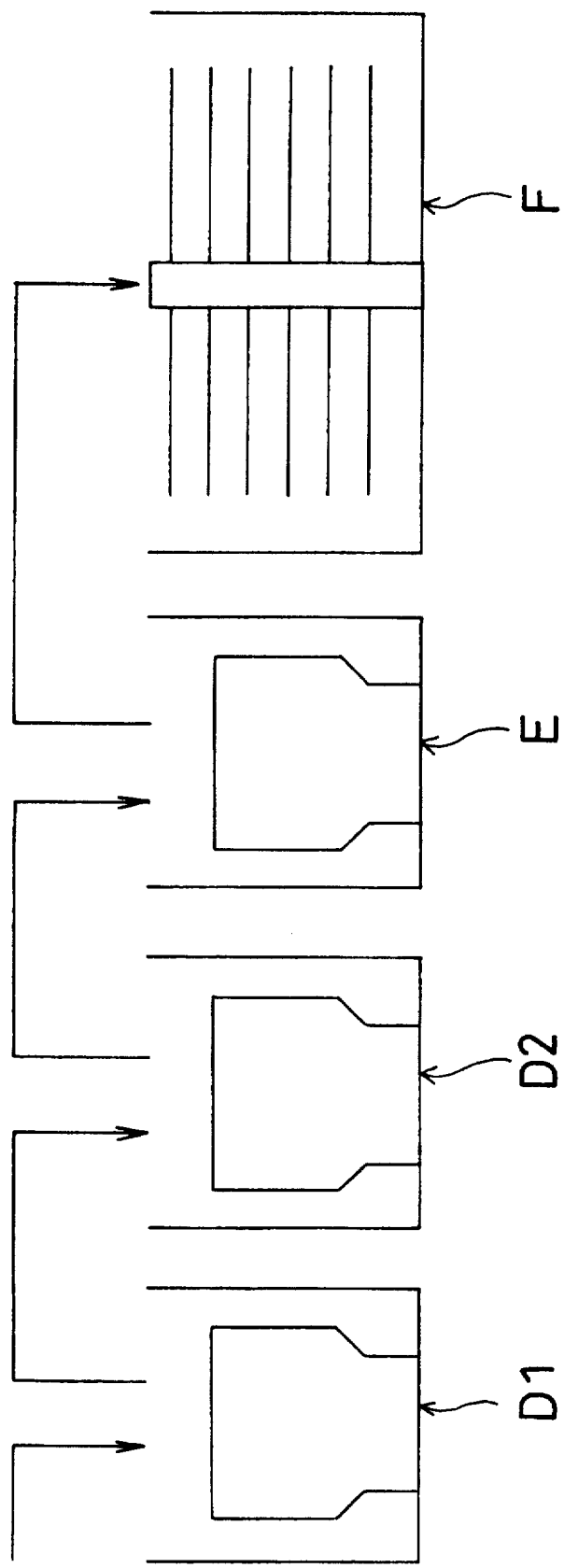
FIG. 9 is a explanatory view for explaining a conventional operation sequence from cleaning to drying of a semiconductor wafer.

In addition, it is too difficult to obtain an ultraclean surface of the wafer 5 and there are some cases that a further clean surface is required, though the surface of the wafer 5 just after the above cleaning or etching is clean to some extent. FIG. 7 shows one example of final cleaning of the wafer surface with the use of gas in the present equipment.

In FIG. 7, after the aforementioned cleaning for a given purpose or etching and drying is finished (step S61), HFAC gas is supplied to the nitrogen gas supply line 17 through the gas line 48 via the inline heater filter block 50 and the valve 49 to completely remove heavy metal remaining on the surface of the wafer 5. At this time, the nitrogen gas to be supplied to the nitrogen gas supply line 17 is heated at 20° C. by the inline heater filter block 41 so as to adjust the concentration of HFAC to be 5%. Such gaseous mixture is supplied from the spray nozzles 7 into the process chamber 1 via the gas valves 42, 43, 44 (step S62). This gas supply is performed for 5 minutes, thereby heavy metal on the surface of the wafer 5 is removed. The gas in the process chamber 1 after the time period is discharged by the discharge line 45 via the discharge valve 46 and the pressure self-adjusting valve 47.

Next, in order to completely remove native oxide, anhydrous hydrogen fluoride gas (anhydrous HF) is supplied from the gas line 48 to the nitrogen gas supply line 17 through the inline heater filter block 50 and the valve 49. The gas is mixed with the nitrogen gas at this time so that the concentration of anhydrous hydrogen fluoride gas is set to about 10% and the temperature thereof is controlled to be 25° C. The gaseous mixture is blown out and supplied form the spray nozzles 7 into the process chamber 1, of which time period depends on native oxide to be removed. Wherein, the time period is set to 30 seconds in this embodiment (step S63).

The surface of the wafer 5 is covered with fluorine or the like after complete removal of heavy metal and native oxide thereon, which is unstable. Therefore, a gaseous mixture of 10% ozone gas and oxygen is supplied to the process chamber 1 from the spray nozzles 7 by the gas line 48 through the inline heater filter block 50, the valve 49 and the nitrogen gas supply means 17. The temperature and time period for supply at this time are set within a range from room temperature to about 300° C. and 30 seconds, respectively. Thereby, a ultraclean, extremely-thin oxide film is formed on the surface of the wafer 5, which functions to protect the wafer surface (step S64). Thus, ultraclean wafer surface is obtained.

The sequence of supplying HFAC and anhydrous HF may be inverted, wherein steps of rinsing by ultrapure water and of drying the wafer may be required after the treatment with anhydrous HF. The anhydrous HF and the like can be used alone for etching oxide film or removing polymer.

When ozone is supplied during the cleaning by aqueous ammonium and hydrogen peroxide, roughness of the wafer surface can be decreased. Further, though a single gas line 48 supplies HFAC, anhydrous HF and ozone in this embodiment, exclusive gas lines for respective gases may be provided.

What is claimed is:

1. Equipment for cleaning, etching and drying a semiconductor wafer, comprising:

a process chamber having a closed space, the temperature of which is capable of being adjusted by a heater;

a supporting member, provided at the center part in the process chamber, for supporting at least one wafer to be cleaned;

a plurality of spray nozzles, each provided linearly at the upper part in the process chamber; and a rotary discharge nozzle provided at the lower part of the process chamber, wherein each of the spray nozzles includes a spray port, for spraying a chemical or ultrapure water, and a nitrogen gas blow-out port, for blowing out nitrogen gas, for atomization by spraying the chemical or ultrapure water in a mist state, and the spray ports of the respective spray nozzles are arranged at almost regular intervals in a direction along which the respective spray nozzles extend.

2. The equipment for cleaning, etching and drying a semiconductor wafer according to claim 1, wherein the rotary discharge nozzle comprises:

a first rotary shaft;

a first arm supported at the center part thereof to the upper end of the first rotary shaft and extending in a direction perpendicular to the first rotary shaft;

second rotary shafts respectively provided at ends of the first arm;

two second arms respectively supported at the center parts thereof to the upper ends of the second rotary shafts and extending in a direction perpendicular to the respective second rotary shafts; and blow-out ports for blowing out chemical or ultrapure water which are respectively provided at ends of each of the second arms, being upwardly inclined at given angles to the respective second rotary shafts, wherein each of the blow-out ports rotates around the respective second rotary shafts as its axes, while revolving around the first rotary shaft as a center.

3. Equipment for cleaning, etching and drying a semiconductor wafer according to claim 1, further comprising:

a plurality of inline heaters for heating the chemical;

a plurality of filters for filtering the chemical to remove foreign matter in the chemical; and a chemical circulation line for selectively forwarding the chemical discharged from a drain port at the lower part of the process chamber to either of the plural inline heaters or the plural filters to blow out again the chemical from the rotary discharge nozzle or the spray nozzles.

4. Equipment for cleaning, etching and drying a semiconductor wafer according to claim 1, further comprising:

a plurality of inline heaters for heating the chemical;

a plurality of filters for filtering the chemical to remove foreign matter in the chemical; and a supply line for selectively forwarding the chemical or the ultrapure water to either of the plural inline heaters for heating the selected chemical or ultrapure water and the plural filters for filtering the selected chemical or ultrapure water in order to blow out the heated and filtered chemical or ultrapure water from the rotary discharge nozzle or the spray nozzles.

5. The equipment for cleaning, etching and drying a semiconductor wafer according to claim 1, further comprising:

a nitrogen gas supply line for supplying nitrogen gas to the spray ports of the spray nozzles, the nitrogen gas supply line having an inline heater capable of heating the nitrogen gas up to 300° C.; and a nitrogen gas discharge line for discharging nitrogen gas in the process chamber from a discharge port at the upper part of the process chamber.

6. The equipment for cleaning, etching and drying a semiconductor wafer according to claim 5, further comprising:

a gas line, connected to the nitrogen gas supply line, for forwarding gas such as ozone gas, anhydrous hydrogen fluoride gas, HFAC (1,1,1,5,5,5,-hexafluoro-2,4-pentanedione) gas into the process chamber through the nitrogen gas supply line and the spray nozzles.

7. A method of using equipment for cleaning, etching and drying a semiconductor wafer of claim 1, comprising the steps of:

sufficiently substituting nitrogen in the process chamber by blowing out, from the spray nozzles, nitrogen gas, which is higher than a set temperature of a cleaning solution, after disposing a wafer to be cleaned onto the supporting member in the process chamber;

forwarding the cleaning solution at the set temperature to the rotary discharge nozzle and cleaning the wafer by blowing out a jet stream of the cleaning solution for a set period of time;

conducting a final cleaning to the surface of the wafer by spraying a new cleaning solution at the set temperature from the spray nozzles for a set period of time;

rinsing the wafer by blowing out ultrapure water from the rotary discharge nozzle for a set period of time, and setting the temperature of the nitrogen gas to be blown out from the spray nozzles to the same temperature as that of the ultrapure water;

rinsing the wafer by spraying ultrapure water in a mist state from the spray nozzles for a set period of time;

supplying an organic solvent to the spray nozzles to spray from the spray nozzles the organic solvent in a heated mist state with heated nitrogen gas, of which temperature is set to near the boiling point of the organic solvent; and drying the wafer, by blowing out heated nitrogen gas from the spray nozzles, while maintaining the process chamber at a heated temperature by a heater of the process chamber.

8. The method of using an equipment for cleaning, etching and drying a semiconductor wafer according to claim 7, wherein etching or polymer removal is conducted by using an etching solution, instead of the cleaning solution.

9. The method of using an equipment for cleaning, etching and drying a semiconductor wafer according to claim 7 or 8, wherein the step of cleaning or etching the wafer by blowing out the chemical of cleaning solution or etching solution from the rotary discharge nozzle for a set period of time comprises the steps of: collecting the chemical discharged from the rotary discharge nozzle from the drain port at the lower part of the process chamber; heating the thus collected chemical to a set temperature and removing foreign matter from the chemical; then blowing out the chemical again from the rotary discharge nozzle.

10. A method of using equipment for cleaning, etching and drying a semiconductor wafer of claim 1, comprising the steps of:

sufficiently substituting nitrogen in the process chamber, by blowing out from the spray nozzles, nitrogen gas, which is higher than a set temperature of a first cleaning solution after disposing a wafer to be cleaned onto the supporting member in the process chamber;

forwarding the first cleaning solution, at the set temperature, to the rotary discharge nozzle, and cleaning the wafer by blowing out a jet stream of the first cleaning solution for a set period of time;

conducting a final cleaning to the surface of the wafer, by spraying new first cleaning solution, at the set temperature from the spray nozzles, for a set period of time;

rinsing the wafer by blowing out ultrapure water from the rotary discharge nozzle for a set period of time, and setting the temperature of the nitrogen gas to be blown out from the spray nozzles to the same temperature as that of the ultrapure water;

rinsing the wafer by spraying ultrapure water in a mist state from the spray nozzles for a set period of time;

repeating the steps of nitrogen substitution, cleanings, and water rinsings, using a second cleaning solution, or a third cleaning solution, which are different from the first cleaning solution in accordance with a respective kind of cleaning;

supplying an organic solvent to the spray nozzles to spray from the spray nozzles the organic solvent in a heated mist state with heated nitrogen gas, of which temperature is set to near the boiling point of the organic solvent; and drying the wafer, by blowing out the heated nitrogen from the spray nozzles, while maintaining the process chamber at a heated temperature, by a heater of the process chamber.

11. A method of using equipment for cleaning, etching and drying a semiconductor wafer of claim 1, comprising the steps of:

after disposing a wafer to be cleaned onto the supporting member in the process chamber, supplying a gaseous mixture of HFAC gas and nitrogen gas heated at 200° C.–250° C. from the spray nozzles, into the process chamber, to remove metal from the surface of the wafer;

supplying anhydrous hydrogen fluoride gas at room temperature, or at a set temperature, from the spray nozzles into the process chamber, to remove native oxide from the surface of the wafer;

water rinsing the wafer, by blowing out ultrapure water from the spray nozzles, or the rotary discharge nozzle, for a set period of time;

supplying an organic solvent to the spray nozzles, to spray the organic solvent, in a heated mist state from the spray nozzles with heated nitrogen gas at the temperature near the boiling point of the organic solvent;

drying the wafer, by blowing out heated nitrogen gas from the spray nozzles, while maintaining the process chamber at a heated temperature, by the heater of the process chamber; and supplying ozone gas, from the spray nozzles, into the process chamber, to form a protection oxide film on the surface of the wafer.

* * * * *